United States Patent [19]

Merrell

[11] 4,151,559
[45] Apr. 24, 1979

[54] ELECTRONIC TELEVISION TUNER INTERFACE CIRCUIT

[75] Inventor: Richard G. Merrell, Darien, Ill.

[73] Assignee: Zenith Radio Corporation, Glenview, Ill.

[21] Appl. No.: 830,949

[22] Filed: Sep. 6, 1977

[51] Int. Cl.² ............................................. H04N 5/50
[52] U.S. Cl. .................................. 358/192; 340/706; 325/455; 340/750
[58] Field of Search ................ 358/192; 340/324 AD; 325/459, 452, 455, 464, 396

[56] References Cited
U.S. PATENT DOCUMENTS
4,081,797  3/1978  Olson .................................... 358/192

Primary Examiner—Richard Murray
Attorney, Agent, or Firm—Nicholas A. Camasto; Jack Kail

[57] ABSTRACT

An electronic television tuning system includes a channel number selection integrated circuit chip interfaced with a channel computer integrated circuit chip by a plurality of data lines. The channel number selection chip, in response to the partial or complete entry of a channel number by the viewer, develops multiplexed digital codes on the data lines representing the channel number entry and, in certain circumstances, a predefined blanking code. A display apparatus, coupled to the data lines, provides an observable indication of the channel number entry, portions of the display being suitably blanked in response to the blanking code. Tuning information and raster blanking signals are developed by the channel computer chip directly from the information supplied on the data lines.

5 Claims, 9 Drawing Figures

| TIME INTERVAL | U | T | U | T | U | T | U | T |
|---|---|---|---|---|---|---|---|---|
| T/Ua – T/Ud | 7 | BC | 7 | BC | 7 | BC | 7 | BC |
| DT | 0 | 1 | 0 | 1 | 0 | 1 | 0 | 1 |
| DU | 1 | 0 | 1 | 0 | 1 | 0 | 1 | 0 |
| B | 0 | 1 | 0 | 1 | 0 | 1 | 0 | 1 |
| J(227) | 1 | 0 | 1 | 0 | 1 | 0 | 1 | 0 |
| K(227) | 0 | 0 | 0 | 0 | 0 | 0 | 0 | 0 |
| Q̄(227) | 0 | 0 | 0 | 0 | 0 | 0 | 0 | 0 |
| J(228) | 1 | 0 | 1 | 0 | 1 | 0 | 1 | 0 |
| K(228) | 0 | 0 | 0 | 0 | 0 | 0 | 0 | 0 |
| Q(228) | 1 | 1 | 1 | 1 | 1 | 1 | 1 | 1 |
| Lu | 1 | 0 | 1 | 0 | 1 | 0 | 1 | 0 |
| Lt | 0 | 1 | 0 | 1 | 0 | 1 | 0 | 1 |
|  | L | L | L | L | L | L | L | L |
|  | R | R | R | R | R | R | R | R |

FIG. 8

| TIME INTERVAL | U | T | U | T | U | T | U | T | U | T | U | T | U | T |
|---|---|---|---|---|---|---|---|---|---|---|---|---|---|---|
| T/Ua – T/Ud | 7 | BC | 7 | 3 | BC | 3 | BC | 3 | BC | 3 | 2 | 3 | 2 | 3 | 2 |
| DT | 0 | 1 | 0 | 1 | 0 | 1 | 0 | 1 | 0 | 1 | 0 | 1 | 0 | 1 | 0 |
| DU | 1 | 0 | 1 | 0 | 1 | 0 | 1 | 0 | 1 | 0 | 1 | 0 | 1 | 0 | 1 |
| B | 0 | 1 | 0 | 0 | 1 | 0 | 1 | 0 | 1 | 0 | 0 | 0 | 0 | 0 | 0 |
| J(227) | 1 | 0 | 1 | 1 | 0 | 1 | 0 | 1 | 0 | 1 | 1 | 1 | 1 | 1 | 1 |
| K(227) | 0 | 0 | 0 | 0 | 1 | 0 | 1 | 0 | 1 | 0 | 0 | 0 | 0 | 0 | 0 |
| Q̄(227) | 0 | 0 | 0 | 0 | 1 | 0 | 1 | 0 | 1 | 0 | 0 | 0 | 0 | 0 | 0 |
| J(227) | 1 | 0 | 1 | 0 | 0 | 0 | 0 | 0 | 0 | 0 | 1 | 0 | 1 | 0 | 1 |
| K(228) | 0 | 0 | 0 | 0 | 0 | 1 | 0 | 1 | 0 | 1 | 0 | 0 | 0 | 0 | 0 |
| Q(228) | 1 | 1 | 1 | 1 | 1 | 0 | 0 | 0 | 0 | 0 | 1 | 1 | 1 | 1 | 1 |
| Lu | 1 | 0 | 1 | 0 | 0 | 0 | 0 | 0 | 0 | 0 | 1 | 0 | 1 | 0 | 1 |
| Lt | 0 | 1 | 0 | 1 | 0 | 1 | 0 | 1 | 0 | 1 | 0 | 1 | 0 | 1 | 0 |
|  | L | L | L | L | L̄ | L | L̄ | L | L̄ | L | L | L | L | L | L |
|  | R | R | R | R | R̄ | R̄ | R̄ | R̄ | R̄ | R | R | R | R | R | R |

FIG. 9

ELECTRONIC TELEVISION TUNER INTERFACE CIRCUIT

BACKGROUND OF THE INVENTION

This invention is related to electronic television tuning systems which vary tuning frequency by a change in voltage applied to a varactor diode tuning device. More particularly, this invention is concerned with apparatus for minimizing the number of interconnections between the integrated circuit chips comprising such a system.

Electronically tuned television receivers can be conveniently classified according to the type of viewer operated channel number input apparatus (hereinafter referred to as channel selection means) employed. Typically, such apparatus are of two general types; the first type comprising a ten digit keyboard whose keys are individually accessable by the viewer for selecting a desired channel number and the second type comprising a sequential control system. In the sequential control system an up/down chnnel selector or the like is operated for sequencing through a predetermined channel program sequence until the desired channel is reached. Frequently, both types of channel selection apparatus are provided as part of the television receiver allowing the viewer to either directly access a television channel through the keyboard or to identify the channel by means of the sequential control system. In any case, the channel number selection means includes appropriate circuitry for generating encoded channel number information enabling tuning by the remainder of the tuner to the corresponding television channel. For purposes of convenience, the latter portion of the tuner, i.e. the portion responsive to the channel selection means, will hereinafter be referred to as the channel computer. It will thus be appreciated that the channel computer operates upon the input channel number information supplied from the channel selection means to tune the system, by applying appropriate voltages to a varactor diode tuning device, to a selected television channel.

U.S. Pat. Nos. 4,002,985 to Merrell and 4,023,107 to Tanaka, both assigned to the assignee of the present invention, disclose electronic tuning systems having a channel computer controlled by a sequential control type channel selection means. Apparatus comprising circuitry enabling the alternative use of keyboard and sequential control type channel selection means for controlling a channel computer is shown in U.S. Pat. No. 3,961,266 to Tanaka also assigned to the assignee of the present invention. Further details of the tuning system shown in the latter mentioned Tanaka patent are disclosed in U.S. Pat. Nos. 3,946,319 to Ma et al. and 3,956,702 to Tanaka.

Common to the foregoing tuning systems is a physical separation of function wherein the circuitry corresponding to the channel selection means, regardless of which generic type or both, and the circuitry corresponding to the channel computer are fabricated on individual integrated circuit chips. In addition, means for displaying the units and tens digits of a selected channel number is also provided as a physically separate unit. Communication between the channel selection and channel computer chips is affected by interface circuitry normally comprising a plurality of data lines connected between suitably located pins on the two chips. Thus, for example, a channel number generated by the channel selection chip in response to a viewer action may be transmitted in multiplexed format to the channel computer chip as BCD channel number information. The data lines carrying the channel number information may also be coupled to the display apparatus for providing a visual indication of the selected channel number.

While other necessary data may be transmitted between the chips in a similar manner, primarily for economy purposes, it is desirable to minimize the number of interfacing lines, and thereby the number of required chip pin-pairs, without sacrificing operational capabilities. In fact, it is frequently more desirable, from a cost perspective, to add a relatively significant amount of circuitry to one or both of the chips than to accomplish the same result through the expedient of providing an interface line interconnecting a pair of pins on the two chips. Although conceptually the elimination of interface lines is therefore a highly worthy design criterion, as a practical matter, its implementation is normally quite difficult to realize.

For example, it is often required that a particular signal be developed in the channel computer chip whenever the channel selection chip is characterized by some particular state. Thus, when only the tens digits of a selected channel number has been entered by means of a keyboard type channel selection means it would be advantageous to develope a signal in the channel computer chip for enabling circuitry for blanking the raster of the viewing screen until a units digits has also been entered. While such can be accomplished in a straightforward manner by running an interface line between a pin on the channel computer chip to a pin connected to an incomplete channel entry circuit on the channel selection chip, such is objectionable as previously described.

Similarly, it is frequently desirable to blank portions of the display depending on the state of the channel selection chip. Although this may be accomplished by coupling an appropriate blanking signal from the channel selection chip to the display, such also involves the use of an addition chip pin. The latter problem is advantageously resolved by coupling a suitable blanking code to the data lines used to transmit the channel number information to the display. The blanking code, however, does not represent legitimate channel number information and may therefore cause erroneous tuning when supplied with the channel number information to the channel computer chip. Yet another line connected from the channel selection chip to the channel computer chip (and its associated chip pins) for controlling the operation of the latter's memory circuits can be provided to alleviate this situation.

In the preferred embodiment of the present invention the need for such additional lines and chip pins is obviated by providing means coupled to the data lines carrying the channel number information and blanking code for insuring proper tuning of the television receiver and for developing the raster blanking signal based solely on information supplied on the data lines.

SUMMARY OF THE INVENTION

An object of the present invention is to provide a novel tuning system.

Another object of the present invention is to provide an improved tuning system using a reduced number of interconnections between the integrated circuit chips constituting the tuning system.

In accordance with these objects a tuning system according to the present invention comprises, fabricated on a first integrated circuit chip, channel selection means operable for generating selected channel numbers and a blanking encoder for generating a blanking code in response to particular states of the channel selection means for suitably blanking portions of a channel number display. The generated channel numbers and blanking code are multiplexed on a plurality of data lines coupled directly to conversion means and decision means fabricated on a second integrated circuit chip. Also fabricated on the latter chip is memory means for storing generated channel numbers. The conversion means couples the memory means to the data lines and at the same time converts the blanking code to a code representing digit zero. The decision means develops output signals for enabling and inhibiting the memory means insuring proper tuning and for controlling the viewing screen raster.

BRIEF DESCRIPTION OF THE DRAWINGS

FIGS. 8 and 9 are charts illustrating the logical levels at various points in the circuitry of FIG. 6 under diverse conditions.

DESCRIPTION OF THE PREFERRED EMBODIMENT

Figure 1:
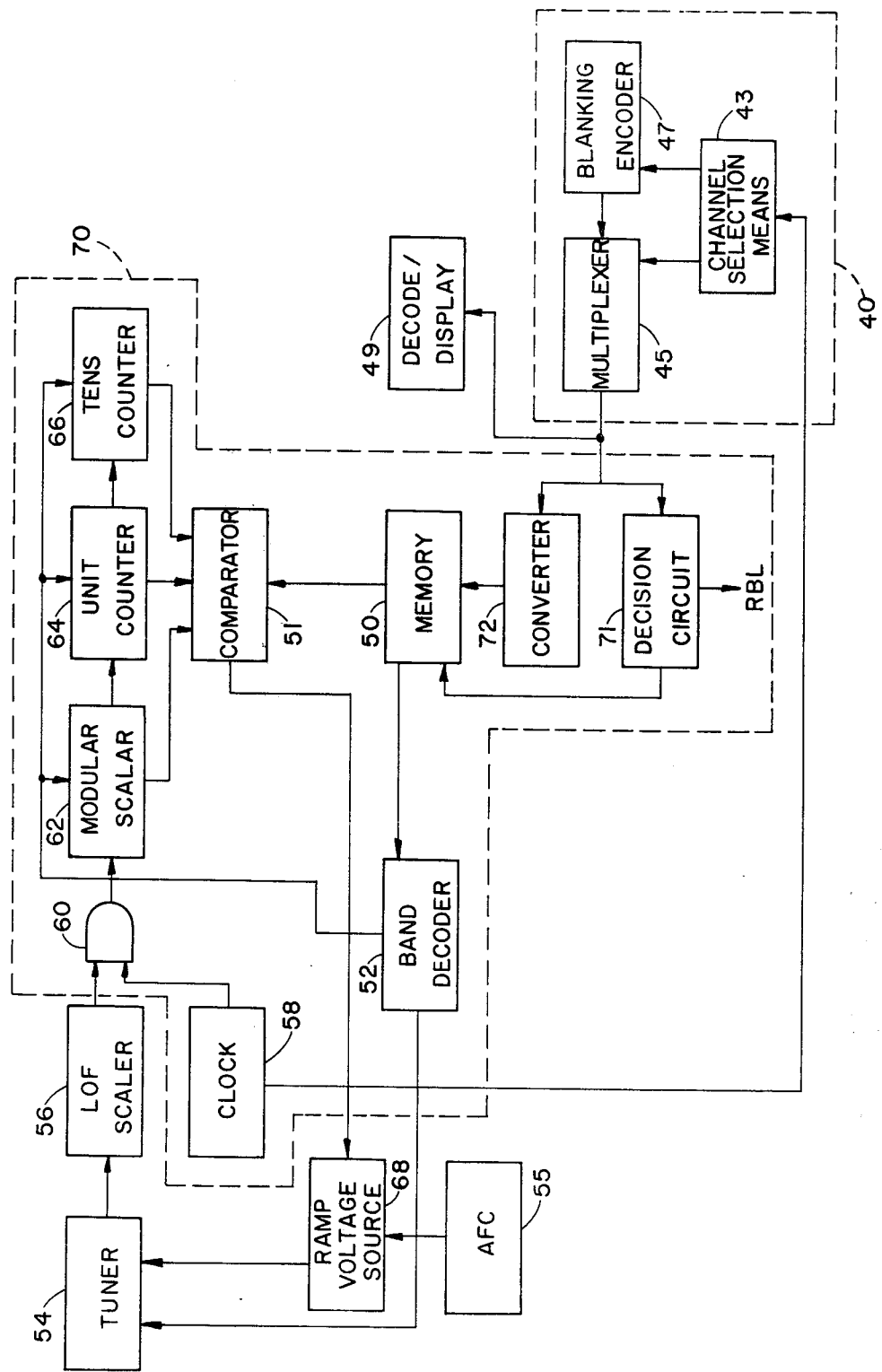
FIG. 1 depicts, in block diagram form, a tuning system employing the present invention.

FIG. 1 is a block diagram depicting a tuning system constructed in accordance with the present invention. While the illustrated system is, to a large extent, described in detail in the previously mentioned patents, see in particular U.S. Pat. Nos. 3,961,266 and 3,946,319, a brief summary of system operation follows herein for purposes of completeness and to facilitate an understanding of the relationship of the present invention thereto.

In FIG. 1, circuitry comprising a channel selection chip 40 is operable by the viewer for developing encoded channel number information for tuning the tuner. Channel selection chip 40 comprises a channel selection means 43 which may include both keyboard and sequential control type channel selection capabilities, an exemplary embodiment of which corresponds to blocks 43-48 of the tuning system disclosed in U.S. Pat. No. 3,961,266. Channel selection means 43 has an input supplied by a clock 58 and outputs coupled to a multiplexer 45 and a blanking encoder 47 also fabricated on channel selection chip 40. Blanking encoder 47 develops a blanking code during particular states of channel selection means 43, the blanking code being multiplexed with the channel number information supplied multiplexer 45 by channel selection means 43. Multiplexer 45 includes an output coupled to a decode/display device 49 for displaying the selected channel number. The output of multiplexer 45 is also coupled to a decision circuit 71 and a converter 72 located on a channel computer chip 70.

Converter 72 and decision circuit 71 couple channel number information to a memory 50 which, in turn, supplies a comparator 51 to cause tuning to the selected channel. Another output of memory 50 is connected to a band decoder 52 which determines, from the encoded channel information stored in memory 50, (1) in which the several discontinuous frequency bands the selected channel is; (2) whether UHF or VHF circuitry in the tuner is activated; and (3) the present information supplied to the channel counting means for decoding of the local oscillator frequency. Accordingly, an output of band decoder 52 is connected to a varactor tuner 54 and another output is connected in common to a modular scaler 62, a units counter 64 and a tens counter 66. The local oscillator signal developed by tuner 54 is coupled through a local oscillator frequency (LOF) scaler 56 whose output, along with a timing output of clock 58, is coupled to the input of a logic gate 60. The signal on the output of gate 60 constitutes the tuning information and comprises a train of local oscillator frequency related pulses in fixed time intervals. The local oscillator frequency (corresponding to the television channel to which the tuner is tuned), which is determined by the counts resulting in appropriately preset modular scaler 62, units counter 64 and tens counter 66 during each sampling interval, is supplied to comparator 51 where it is compared with the encoded channel number information stored in memory 50. As each comparison is made, signals dependent upon the condition of comparator 51 are coupled to a ramp voltage source 68 which drives tuner 54 to make corrective changes in its local oscillator frequency until comparator 51 indicates equality, to within a preselected range of frequencies, between the derived channel number and the selected channel number.

A conventionally derived automatic frequency control (AFC) voltage source 55 is coupled to ramp voltage source 68 for maintaining the tuner local oscillator frequency tuned to the received signal picture carrier frequency.

Figure 2:
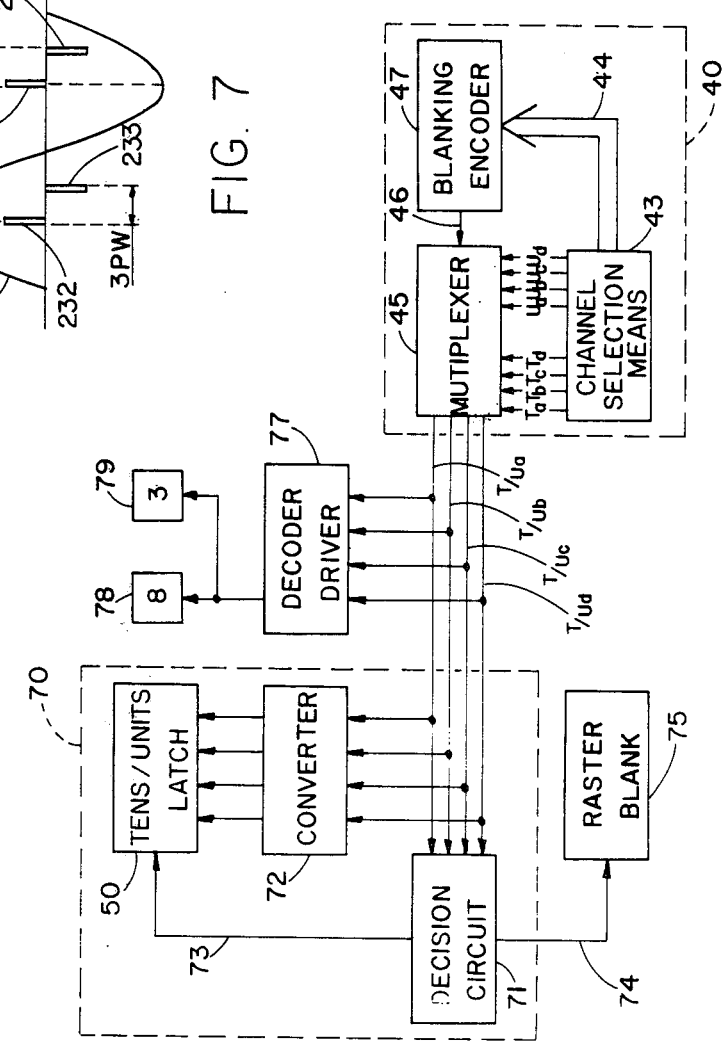
FIG. 2 shows a somewhat more detail the portions of FIG. 1 directly related to the present invention.

FIG. 2 more particularly shows the portions of the tuning system directly pertaining to the present invention. Channel selection means 43 has two groups of four output lines coupled to multiplexer 45 and a third group of output lines 44 coupled to blanking encoder 47. The first group of output lines, identified by reference designations $T_a$-$T_d$, couple the tens digit of the selected channel number to multiplexer 45 in BCD format. Similarly, the second group of output lines, identified by reference designations $U_a$-$U_d$, couple the units digit of the selected channel number to multiplexer 45. Blanking encoder 47 decodes particular states of channel selection means 43 on the basis of signals derived from line 44. When a decoding criterion is satisfied, blanking encoder 47 couples a blanking command to multiplexer 45 over a line 46. The output of multiplexer 45 thus consists of the multiplexed tens and units digits of a selected television channel number modified by a blanking code initiated in response to blanking commands developed on line 46. The outputs of multiplexer 45 are correspondingly identified as $T/U_a$, $T/U_b$, $T/U_c$ and $T/U_d$. Thus, the first bits of the BCD encoded tens and units digits of a selected channel number are developed during alternate time intervals by multiplexer 45 on line $T/U_a$, the second bits are simultaneously developed on line $T/U_b$ and so on. Furthermore, the blanking code is developed on lines $T/U_a$-$TU_d$ during the time intervals normally occupied by either the tens or units digits in response to particular conditions of channel selection means 43. It will therefore be apparent that at any particular moment of time the signal present on lines $T/U_a-T/U_d$ will constitute either the BCD encoded tens digit of a selected channel number, the BCD encoded units digit of the selected channel number or the blanking code.

Decode/display 49 comprises a decoder driver 77 coupled to lines $T/U_a-T/U_d$ for converting the multiplexed channel number information and blanking code for displaying a selected channel number. An output of decoder driver 77 is coupled to a tens display 78 and a units display 79 in which an observable representation of the channel number is developed. In particular, when tens digit channel number information is received during the tens time interval, the corresponding tens digits is displayed by tens display 78. Similarly, when units digit channel number information is received during the units time interval, the corresponding units digit is displayed by units display 79. However, when the blanking code is received during either the tens or units digits time intervals, the corresponding tens or units display is blanked.

Blanking of portions of channel number display 78, 79 is desirable in several different situations. For instance, if a selected channel number is completely specified on output lines $T_a-T_d$ and $U_a-U_d$ and the channel number includes a zero as the tens digit (e.g. channel number 07) it would be desirable to blank the tens digit rather than displaying the numeral 0. In a keyboard type channel number entry system it would be useful to blank the units digit of the display where the channel number has been only partially specified. That is, if only one digit of a desired channel number has been selected by use of the keyboard, units display 79 is blanked until a second digit has been entered. Finally, in a sequential control type channel number entry system operated in the program mode, it is useful to alternately blank and unblank the tens and units display in unison to indicate skipped memory locations. Such would indicate to the viewer that when in the operate mode the sequential control system would skip the channel corresponding to that memory location. All of the foregoing blanking operations can be realized by the judicious generation of blanking commands on line 46 by blanking encoder 47 based on the state of channel selection means 43.

The four output data lines $T/U_a-T/U_d$ from multiplexer 45 are coupled to channel computer chip 70 and supplied in parallel to decision circuit 71 and converter 72. Since the blanking code can consist of any arbitrary four bit digital number, its direct application to memory 50 will cause the tuner to erroneously tune the television receiver. For instance, in the case of a selected channel number having a zero value tens digit it will be recalled that the blanking code is developed on data lines $T/U_a-T/U_d$ during the tens digit time interval. Should the blanking code be applied directly to memory 50 the tuner would erroneously tune to a channel having a tens digit corresponding to the blanking code and a units digit corresponding to the selected channel. Converter 72 circumvents this problem by converting the blanking code to a zero value code; that is, converter 72 converts the blanking code to 0000. All other channel number codes are coupled unmodified by converter 72 from data lines $T/U_a-T/U_d$ to memory 50.

Decision circuit 71 consists of circuitry for accomplishing two basic functions. Initially, decision circuit 71 develops a signal on a first output 73 for inhibiting memory 50 under certain conditions. Decision circuit 71 also develops signals on a second output 74 which are coupled to a raster blanking circuit 75 for blanking the viewing screen of the receiver during particular states of channel selection means 43. Since decision circuit 71 develops the raster blanking signal on line 74 only in response to information supplied by data lines $T/U_a-T/U_d$ the need for an additional line coupled between channel selection means 43 and raster blanking circuit 75 is obviated.

The raster blanking function is initiated and maintained by decision circuit 71 in the case of an incomplete channel number entry from a keyboard channel selection means. Thus, where the tens digit of a desired channel number has been entered on the keyboard, the raster is blanked until the channel number is completely specified by the subsequent entry of an appropriate units digit. Furthermore, until the channel number is completely specified decision circuit 71 inhibits memory 50 from latching to the 0000 code supplied by converter 72 during the units time intervals. Also, memory 50 is inhibited from latching to the 0000 codes supplied by converter 72 corresponding to the blanking codes generated to indicate a skipped channel memory location of a sequential control system operated in the program mode. This is necessary in order to allow proper display of the video information being received on the channel corresponding to the skipped memory location.

Figure 3:
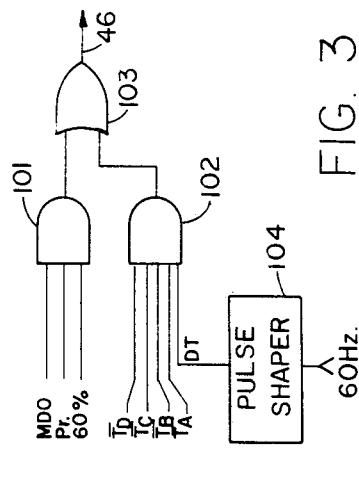
FIGS. 3 and 4 show detailed circuitry embodiments of block 47 of FIGS. 1 and 2.
Figure 4:
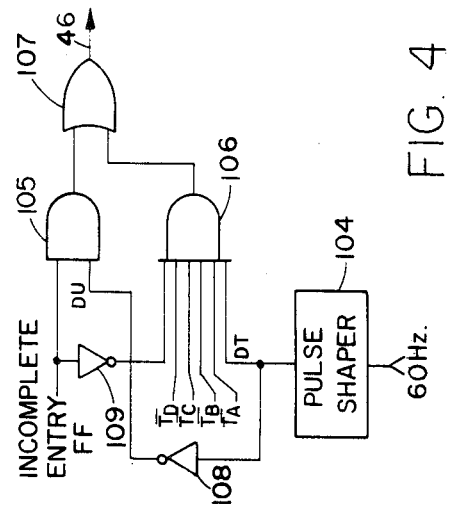

Two exemplary embodiments of blanking encoder 47 are illustrated in FIGS. 3 and 4. The blanking encoder shown in FIG. 3, which is suitable for use with a sequential control type channel selection means, comprises a pair of AND gates 101 and 102 having outputs coupled to an OR gate 103. The output of OR gate 103 consists of line 46 which is coupled to multiplexer 45. The three inputs to AND gate 101 from channel selection means 43 comprise an MDO signal which is at a logical 1 level when the sequential control system is in a skipped channel state, a program signal which is at a logic 1 level whenever the sequential control system is in its program mode of operation and a 60% duty cycle signal. Generation of the foregoing signals are fully described in previously mentioned U.S. Pat. No. 4,002,985. Thus, when the sequential control system is in its program mode of operation and characterized by a skipped channel memory location a blanking command will be developed on line 46 comprising a signal having a 60% duty cycle.

The five inputs to AND gate 102 comprise signals $\overline{T}_a$, $\overline{T}_b$, $\overline{T}_c$, $\overline{T}_d$ and a signal DT. Signal DT comprises a 60 Hz square wave having a logical 1 level during the tens digit time intervals and is obtained by coupling the 60 Hz line signal through a conventional pulse shaper 104. Consequently, if the tens digit of a selected channel number is zero, a blanking command will be developed on line 46 during the tens digit time intervals.

The blanking encoder shown in FIG. 4 is adapted for use with a keyboard type channel selection means. The illustrated encoder comprises a pair of AND gates 105 and 106 having outputs coupled to the input of an OR gate 107. The output of OR gate 107 again comprises line 46 which is coupled to multiplexer 45. AND gate 105 receives an input from an incomplete entry flip-flop (flip-flop 162 illustrated in FIG. 5 of U.S. Pat. No. 3,961,266) which is at a logical 1 level whenever an incomplete channel number entry has been made; that is, whenever only one digit has been entered by means of the keyboard. The remaining input to AND gate 105 comprises a signal DU obtained from an inverter 108 connected to the output of pulse shaper 104 and characterized by a logical 1 level during the units digit time intervals. Consequently, a blanking command is developed on line 46 during the units digits time intervals whenever an incomplete channel number entry has been made. The inputs to AND gate 106 correspond to the inputs to AND gate 102 and further include an input from an inverter 109 coupled to the incomplete entry flip-flop. As a result, a blanking command is developed on line 46 during the tens digits time intervals whenever a selected channel number is completely entered and is characterized by a zero value tens digits.

Figure 5:
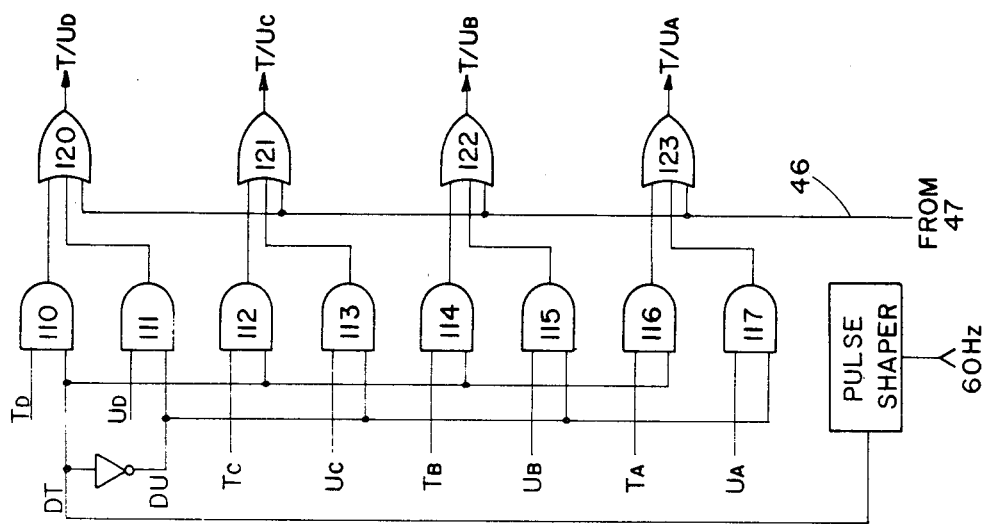
FIG. 5 shows the detailed circuitry of one embodiment of block 45 of FIGS. 1 and 2.

FIG. 5 illustrates one embodiment of multiplexer 45 suitable for use with the blanking encoders shown in FIGS. 3 and 4. The illustrated multiplexer comprises four pairs of AND gates 110-111, 112-113, 114-115, and 116-117. The two outputs of each of pair of the AND gates is coupled, respectively, to one of a series of four OR gates 120-123. A final common input to OR gates 120-123 is coupled to output line 46 of blanking encoder 47 for receiving the blanking command signals. The outputs of OR gates 120-123 comprise data lines $T/U_a$-$T/U_d$ coupled from channel selection chip 40 to decoder driver 77 and to channel computer chip 70. A first input to AND gates 110, 112, 114, and 116 comprises the tens digit channel number bit information $T_a$-$T_d$ respectively. Similarly, a first input to ANd gates 111, 113, 115 and 117 comprises the units digit channel number bit information $U_a$-$U_d$. Finally, each of the AND gates connected for receiving a tens digit channel number bit includes a second input connected for receiving signal DT and each of the AND gates connected for receiving a units digit channel number bit includes a second input connected for receiving signal DU. From the foregoing it will be appreciated that during the alternate time intervals when signal DT is logical 1 the tens digit BCD encoded channel number information will be developed on data lines $T/U_a$-$T/U_d$. During the remaining time intervals, i.e. when signal DU is logical 1, the units digit BCD encoded channel number information will be developed on data lines $T/U_a$-$T/U_d$. However, whenever a blanking command is developed on line 46 by blanking encoder 47 the blanking code 1111 will be generated on output data lines $T/U_a$-$T/U_d$.

Figure 6:
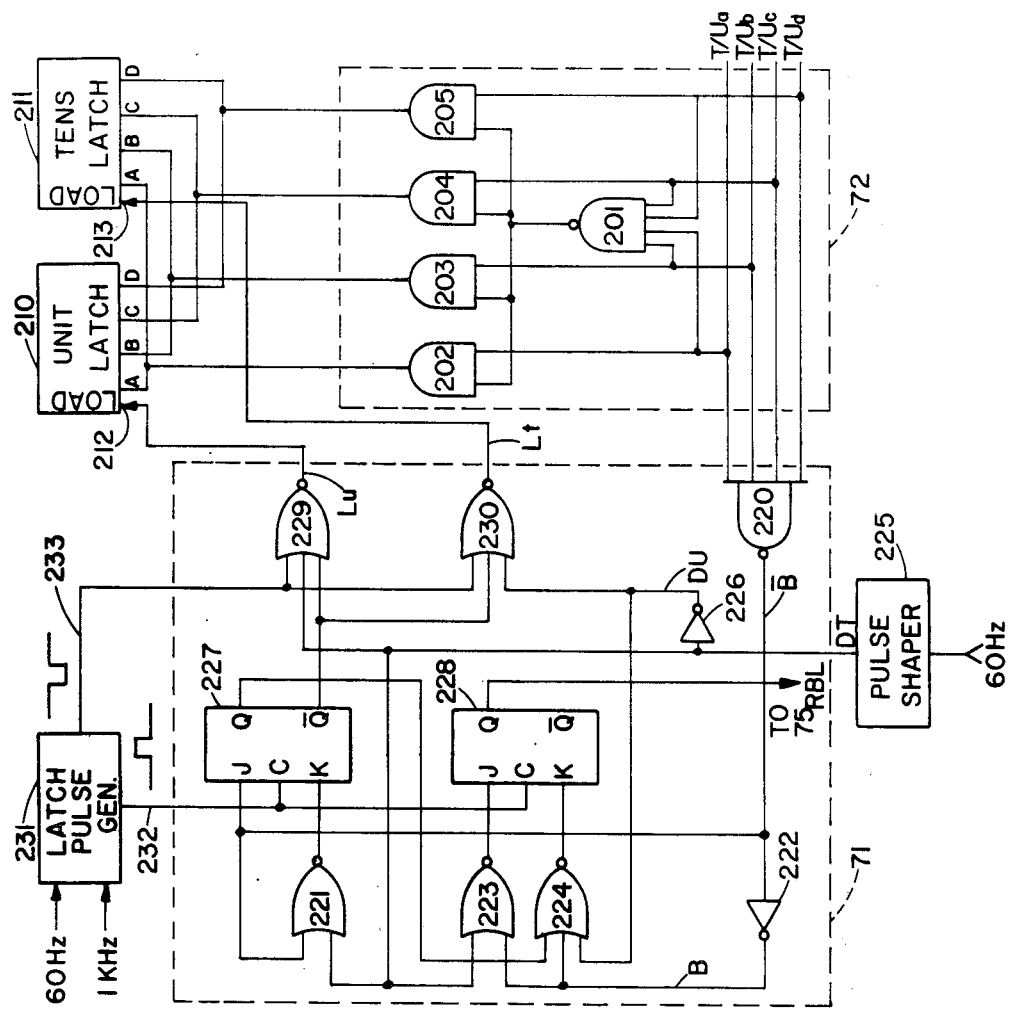
FIG. 6 shows the detailed circuitry of embodiments of blocks 71 and 72 of FIGS. 1 and 2.

The preferred embodiments of decision circuit 71 and converter 72 are illustrated in FIG. 6. Converter 72 comprises a NAND gate 201 having four inputs each connected to one of the data lines $T/U_a$-$T/U_d$. The output of NAND gate 201 supplies a first input of a plurality of AND gates 202-205. The second inputs of AND gates 202-205 are coupled to data lines $T/U_a$-$T/U_d$ respectively. The output of each of AND gates 202-205 is coupled to a common line feeding a units latch 210 and a tens latch 211. Latch loading is controlled by the logic level of signals applied to load inputs 212 and 213; a 0 level signal inhibiting loading and a 1 level signal enabling loading. It will be observed that the appearance of a 1111 blanking code on data lines $T/U_a$-$T/U_d$ causes the outputs of AND gates 202-205 to all be at logical 0. The blanking code 1111 is thereby converted to the zero value code 0000. any other BCD code developed on the data lines is coupled through converter 72 to units latch 210 and tens latch 211 unmodified.

The multiplexed channel number information and blanking code on the data lines is coupled to decision circuit 71 by means of NAND gate 220. The output of NAND gate 220 is coupled to one input of a NOR gate 221 and through an inverter 222 to the inputs of a pair of NOR gates 223 and 224. The other inputs of NOR gates 221 and 223 are connected in common to a pulse shaper 225 which develops at its output signal DT corresponding to and derived in a similar fashion as signal DT on channel selection chip 40. Pulse shaper 225 is supplied from the 60 Hz line signal. A second input of NOR gate 224 is coupled to a source of signal DU consisting of the output of an inverter 226 whose input is supplied from pulse shaper 225.

A pair J-K flip-flops 227 and 228 constitute the signal storage elements of decision circuit 71. Flip-flop 227 has its J input coupled to the output of NAND gate 220 and its K input to the output of NOR gate 221. Flip-flop 228 has its J and K inputs coupled to the outputs of NOR gates 223 and 224 respectively. A final input of NOR gate 224 is supplied from the Q output of flip-flop 227. Finally, a pair of output NOR gates 229 and 230 have outputs connected to inputs 212 and 213 of units latch 220 and tens latch 221 respectively for controlling the operation of the latches. Both NOR gates 229 and 230 have one input coupled to the $\overline{Q}$ output of flip-flop 227, NOR gate 229 having a second input connected for receiving signal DT and NOR gate 230 having a second input connected for receiving signal DU. A logical 0 latch inhibit signal is developed on the outputs of NOR gates 229 and 230 whenever the $\overline{Q}$ output of flip-flop 227 is at a logical 1 level. When the $\overline{Q}$ output of flip-flop 227 is at logical 0, a logical 1 latch enable signal is developed on the output of either NOR gate 229 or NOR gate 230 depending upon the state of signal DT and its complement signal DU. A raster blank condition corresponds to a logical 0 level signal at the Q output of flip-flop 228.

Figure 7:
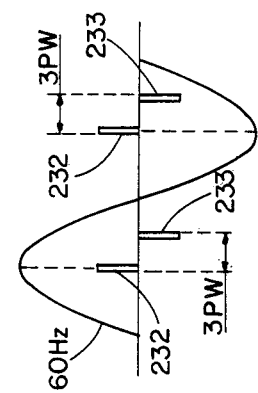
FIG. 7 illustrates the relationship of the clock pulses used to operate portions of the circuitry shown in FIG. 6.

To accommodate propagation delays and the like flip-flops 227 and 228 and NOR gates 229 and 230 are operated by means of clock pulses developed in a latch pulse generator 231. Latch pulse generator 231 receives a 60 Hz line input and a 1 Kz input from clock 58. In turn, a clock signal consisting of a train of positive going relatively narrow clock pulses (approximately 1 ms in duration) occurring at the peaks of the 60 Hz line signal is developed on a first output 232 and applied to the clock inputs of flip-flops 227 and 228. A similar train of clock pulses having a negative polarity and lagging the clock pulses developed on output 232 by three pulsewidths PW is developed on a second output 233 and applied to the final inputs of NOR gates 229 and 230. The relationship between the clock pulses developed on output lines 232 and 233 is illustrated in FIG. 7.

The operation of decision circuit 71 is most clearly explained with reference to the charts of FIGS. 8 and 9. In this regard, it will be useful to define various parameters as follows: the abreviation BC will be used to represent the 1111 blanking code; DT=1 represents the tens digit time interval of the multiplexed channel number information; DU=1 represents the units digit time interval of the multiplexed channel number information; B=1 represents the existence of the blanking code on the data lines; $L_u$=1 represents the output of NOR gate 229 for enabling units latch 220; $L_t$=1 represents the output of NOR gate 230 for enabling tens latch 211; and the representations L and R indicate an enabled latching operation and an unblanked raster respectively.

Referring now to FIG. 8, there is illustrated the logical conditions of decision circuit 71 in response to the complete entry in channel selection means 43 of channel number 07. Thus, during the units time intervals U the signals on data lines $T/U_a$-$T/U_d$ represent the digit 7. Furthermore, during the units interval signal DT=0, DU=1 and B=0. The J and K inputs of flip-flop 227 are thus 1 and 0 respectively and the $\overline{Q}$ output is 0. The J and K inputs of flip-flop 228 are also 1 and 0 respectively and the Q output is 1. Accordingly, it will be observed that $L_u$=1 and $L_t$=0. The foregoing indicates that during the units digit interval the raster will be displayed (the Q output of flip-flop 228 equals 1) and that units latch 210 will load the digit 7 while tens latch 211 is inhibited.

As previously, discussed, during the immediately following tens digit time interval T the blanking code is developed on the data lines to blank the tens digit portion of the display. Thus, during this time interval B=1, DT=1 and DU=0. The J and K inputs of flip-flop 227 are both 0 and the $\overline{Q}$ output is also 0. It will also be noted that the J and K inputs of flip-flop 228 are both 0 while its Q output is 1. Finally, NOR gates 229 and 230 are activated such that $L_u$=0 and $L_t$=1. Accordingly, during the tens time interval the raster is unblanked (the Q output of flip-flop 228 is 1), units latch 210 is inhibited and tens latch 211 is enabled. Thus, tens latch 211 will load the code 0000 supplied by converter 72 from the input 1111 blanking code on the data lines.

The foregoing logical operations are repeated during subsequent units and tens time intervals as shown in FIG. 8 wherein the turner is caused to tune to channel 07. It will be noted that the units and tens latch are alternately enabled for loading the units and tens digit channel number information and that the raster remains unblanked.

FIG. 9 represents the logical conditions of decision circuit 71 ensuing when the viewer tunes the receiver to channel 32 from channel 07. The first three columns are a continuation of the chart of FIG. 8, column 4 representing the initial keyboard entry of tens digit 3. During this latter time interval, DT=1, DU=0 and B=0. Thus, the J and K inputs of flip-flop 227 are 1 and 0 respectively and the J and K inputs of flip-flop 228 are both 0. The $\overline{Q}$ output of flip-flop 227 is 0 and the Q output of flip-flop 228 is 1. The raster therefore remains unblanked and the digit 3 is loaded into tens latch 221. Assuming that the units digit 2 is not immediately entered on the keyboard, the blanking code will be developed on the data lines during the immediately succeeding units time interval. Without going through the details, it will be observed that the raster remains unblanked but that both the tens and units latches are inhibited. During subsequent time intervals the raster is blanked and the latches are alternately enabled and inhibited until the digit has been appropriately entered. Thereafter, the raster remains unblanked and the latches are suitably enabled.

Similar analysis of decision circuit 71 may be made for other modes of operation of the present invention. With particular regard to the 60% duty cycle blanking command generated by blanking encoder 47, see FIG. 3, to indicate a skipped channel memory location, it will be appreciated by those skilled in the art that techniques must be employed to distinguish this condition from the case where a blanking command is generated to blank a zero value tens digit. For this purpose, the 60% duty cycle signal supplying AND gate 101 is generated such that the blanking command developed in response thereto is initiated at the beginning of a units digit interval. The blanking command remains at a logical 1 level for the immediately following three units and tens digit intervals whereupon it assumes a logical 0 level for the next two units and tens digit intervals. This sequence then repeats as long as the necessary inputs to AND gate 101 are present.

While particular embodiments of the invention have been shown and described, it will be obvious to those skilled in the art that changes and modifications may be made thereto without departing from the invention in its broader aspects and, therefore, the aim in the appended claims to cover all such changes and modifications as fall within the true spirit and scope of the invention.

What is claimed is:

1. A tuning system for use with a television receiver comprising:

channel selection means operable for generating selected channel numbers for tuning all channels;

blanking encoder means for generating a blanking code in response to particular states of said channel selection means;

multiplexing means having a plurality of output data lines, said multiplexing means coupling, during alternate time intervals, the units and tens digits of a generated channel number to said data lines, said multiplexer means coupling said blanking code to said data lines during those of said time intervals corresponding to the generation of said blanking code;

memory means for storing generated channel numbers;

means responsive to said memory means for tuning said television receiver to a stored channel number;

conversion means coupling said memory means to said data lines, said conversion means converting said blanking code to a code representing digit zero; and decision means coupled to said data lines and having first and second outputs, said decision means developing signals on said first output for enabling and inhibiting said memory means and signals on said second output for controlling the raster of said television receiver.

2. The television tuning system according to claim 1 including means comprising a tens and units display coupled to said data lines for displaying the tens and units digits of a generated channel number and for blanking said tens and units display in response to said blanking code.

3. The television tuning system according to claim 1 wherein said channel selection means comprises keyboard input means and wherein said blanking encoder means is configured for generating said blanking code during the units digit intervals of an incompletely generated channel number, said decision means developing, on said first output, a signal for inhibiting said memory means during said units digits intervals, on said second output, a signal for blanking the raster of said television receiver.

4. The television tuning system according to claim 1 wherein said blanking encoder means is configured for generating said blanking code during the tens digits intervals of a generated channel number characterized by a zero-value tens digit, said decision means developing, on said first output, a signal for enabling said memory means during said tens digit intervals and, on said second output, a signal for illuminating the raster of said television receiver.

5. The television tuner according to claim 1 wherein said conversion means and said decision means each comprise a NAND gate having inputs coupled to said data lines for recognizing said blanking code.

* * * * *